(12) United States Patent
Song et al.

(10) Patent No.: US 6,740,587 B2
(45) Date of Patent: May 25, 2004

(54) SEMICONDUCTOR DEVICE HAVING A METAL SILICIDE LAYER AND METHOD FOR MANUFACTURING THE SAME

(75) Inventors: Won-Sang Song, Seoul (KR); Jeong-Hwan Yang, Suwon-si (KR); In-Sun Park, Suwon-si (KR); Byoung-Moon Yoon, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 177 days.

(21) Appl. No.: 09/949,853

(22) Filed: Sep. 12, 2001

(65) Prior Publication Data

US 2002/0036353 A1 Mar. 28, 2002

(30) Foreign Application Priority Data

Sep. 22, 2000 (KR) .......................... 2000-55769

(51) Int. Cl.⁷ ................................ H01L 21/44
(52) U.S. Cl. ................ 438/682; 438/683; 438/655; 438/656; 438/657; 438/658; 438/664
(58) Field of Search ................ 438/682, 683, 438/655, 656, 657, 658, 664

(56) References Cited

U.S. PATENT DOCUMENTS

| | | | |
|---|---|---|---|
| 5,512,516 A | * 4/1996 | Nishida et al. ............ 438/648 |
| 5,780,929 A | 7/1998 | Zeininger et al. ............ 257/751 |
| 5,830,775 A | * 11/1998 | Maa et al. .................. 438/141 |
| 6,096,647 A | * 8/2000 | Yang et al. ................. 438/682 |
| 6,136,705 A | * 10/2000 | Blair .......................... 438/682 |
| 6,165,903 A | * 12/2000 | Besser et al. ............... 438/682 |
| 6,238,986 B1 | * 5/2001 | Kepler et al. ............... 438/301 |
| 6,265,271 B1 | * 7/2001 | Thei et al. .................. 438/296 |
| 6,383,922 B1 | * 5/2002 | Zhang et al. ............... 438/655 |
| 2002/0022366 A1 | * 2/2002 | Cabral et al. ............... 438/682 |

* cited by examiner

*Primary Examiner*—George Fourson
*Assistant Examiner*—Thanh Pham
(74) *Attorney, Agent, or Firm*—Lee & Sterba, P.C.

(57) ABSTRACT

The present invention provides a semiconductor device having a metal suicide layer and a method for forming the metal silicide layer, the semiconductor device having a metal silicide-semiconductor contact structure, wherein the semiconductor device includes a substrate, an insulation layer with an opening, in which a metal silicide layer is formed using a native metal silicide with a first phase and a second phase, upon which a conductive layer is formed. The second phase has a first stoichiometrical composition ratio different from a second stoichiometrical composition ratio of the first phase. A reaction between the metal silicide layer of the first phase and the silicon results in the metal silicide layer of the second phase having high phase stability and low resistance.

24 Claims, 8 Drawing Sheets

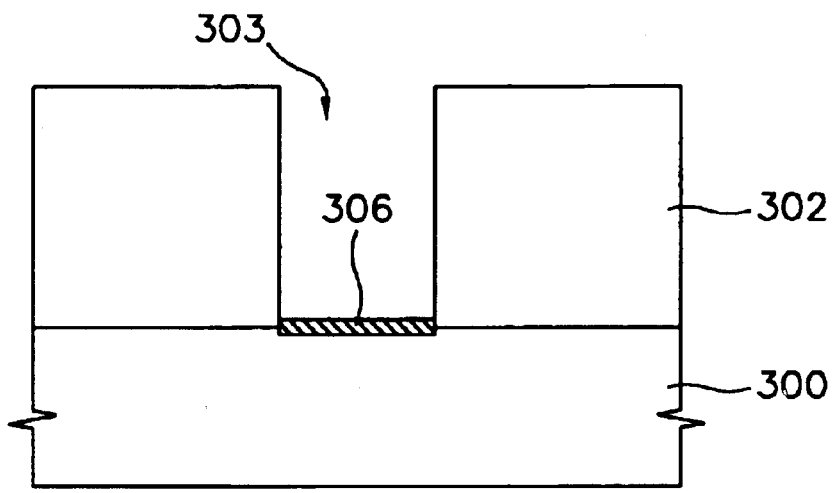
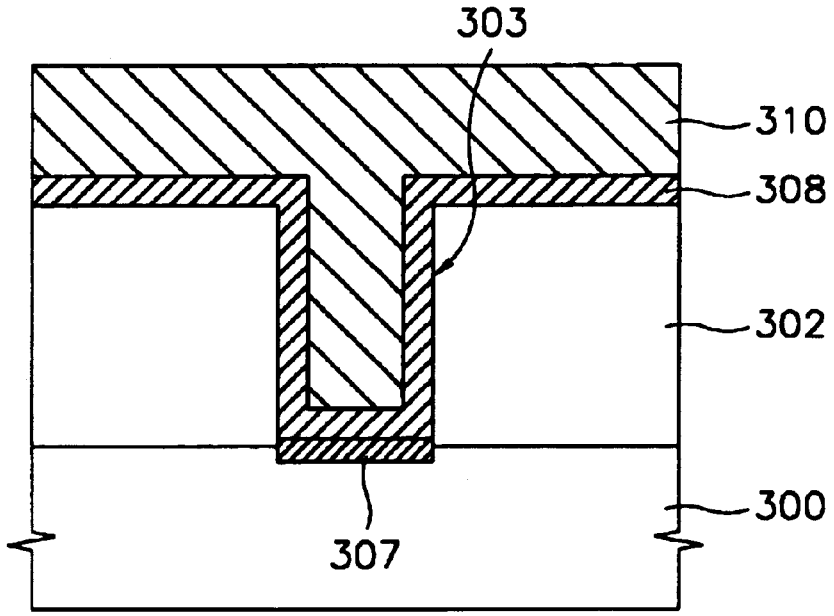

SEMICONDUCTOR DEVICE HAVING A METAL SILICIDE LAYER AND METHOD FOR MANUFACTURING THE SAME

BACKGROUND OF THE INVENTION

1. Field of the Invention

The present invention relates to a semiconductor device and a method for manufacturing the same. More particularly, the present invention relates to a semiconductor device which is formed with a low resistance metal suicide layer having a superior phase stability and to a method for manufacturing the metal silicide layer.

2. Description of the Related Art

As semiconductor devices become more highly integrated, the design rule of a device, such as channel length, an interval between the active areas, a wiring width, a wiring interval, and a contact size of a transistor are scaled-down. Regarding the contact size of a transistor, a silicidation process for forming a metal suicide is carried out in order to obtain a low resistance contact. Reducing the size of the contact causes the thickness uniformity of a silicide layer and the step coverage of the silicide layer to be of inferior quality.

Conventionally, the metal silicide layer is formed on a bottom of a contact hole or a via hole using an argon sputtering process and an evaporation process using an electronic beam. However, use of those processes results in less step coverage than if a CVD (chemical vapor deposition) process is used. Additionally, it is difficult to uniformly control the thickness of the silicide layer.

When the metal silicide layer is formed using the CVD process, silicon etching can occur depending on the vacuum levels caused by the source gas which is deposited at a high temperature. In addition, the isotropic deposition feature can cause undesired metal deposition at sidewalls of the contact hole or the via hole. Accordingly, the silicon deposited on the bottom of the contact hole reacts with the metal deposited on the sidewalls of the contact hole. In this case, the silicon is over-consumed, so bulk depletion and voids are generated, which cause contact resistance failure. In addition, the step coverage may be reduced depending on the aspect ratio of the contact hole when the silicide layer is formed using the CVD process.

U.S. Pat. No. 5,780,929 discloses a method for forming a defect enhanced cobalt silicide layer. According to the disclosure of the above-referenced U.S. patent, a silicon substrate is defected by implanting argon into the silicon substrate without performing a separate heat treatment process. However, it is difficult to defect the silicon substrate properly, so the defection remaining on a surface of the silicon substrate can act as a source of current leakage. In addition, since the resistance is increased due to the argon implanted into the silicon substrate, the resistance reducing effect of a shallow silicide layer is reduced when a shallow junction is formed using the above method.

On the other hand, as the design rule of the device is scaled down, a margin is required with respect to a short channel effect and a punch-through of the transistor. Accordingly, forming a shallow junction of a source/drain area and reducing the parasitic resistance, such as a sheet resistance and a contact resistance, of the source/drain area are required. For this reason, a self-aligned silicide (hereinafter, referred to as "salicide") process has been developed, in which the silicide is selectively formed on a surface of a gate and a surface of a source/drain area to reduce the non-resistance of the gate, and the sheet resistance and contact resistance of the source/drain area.

According to a conventional salicide process, a metal layer is deposited in a sputtering method. Then a first heat-treatment process is carried cut to form a metal silicide layer having a first phase. Non-reacted metal layers are selectively removed by a wet etching process. Then, a second heat-treatment process is carried out to form a metal silicide layer having a second phase, which is stable with respect to the resistance and the phase stability as compared with the metal silicide having the first phase. However, the conventional salicide process does not uniformly form a shallow silicide layer having a thickness of less than 400 Å, which is problematic. When a silicide layer having a thickness of greater than 400 Å is formed, the uniformity of thickness and the uniformity of the surface roughness are reduced. Furthermore, the distance between the junction portion and the silicide layer is irregularly formed making it difficult to preserve the junction. For example, if the salicide process is carried out after depositing a cobalt layer having a thickness of greater than 100 Å, the thickness difference of a cobalt disilicide layer ($CoSi_2$) having a thickness of 300 to 400 Å is greater than ±150 Å. In addition, since the heat-treatment process is carried out twice, the high heat budget can cause the agglomeration of the metal silicide layer and lateral over-growing.

In order to solve the aforementioned problems, a process for forming an epitaxial suicide layer has been suggested. However, this process requires a monocrystalline silicon seed and therefore, is not adapted for the polycrystalline silicon layer. In addition, the vacuum level of the process chamber has to be maintained below 1E-10 torr in order to obtain reproducibility. Furthermore, the deposition speed and the throughput are reduced; hence, it is not adapted for mass-production.

SUMMARY OF THE INVENTION

In order to solve the aforementioned problems, it is a feature of an embodiment of the present invention to provide a semiconductor device which achieves a low contact resistance by forming an ohmic contact with respect to a semiconductor layer by using a metal silicide thin film.

Another feature of an embodiment of the present invention is to provide a method for forming a low resistance metal silicide having a high phase stability by using native metal silicide formed at an interfacial area between metal and silicon.

Still another feature of an embodiment of the present invention is to provide a method for forming a metal silicide layer in a semiconductor device, in which a salicide process can be achieved by using native metal silicide formed at an interfacial area between metal and silicon.

In an embodiment of the present invention, there is provided a semiconductor device having a metal silicide-semiconductor contact structure, the semiconductor device comprising: a substrate; an insulation layer having an opening formed on the substrate; a metal silicide layer formed in the opening of the insulation layer, by using a native metal suicide having a first phase, the metal silicide layer having a second phase which has a first stoichiometrical composition ratio that is different from a second stoichiometrical composition ratio of the first phase; a conductive layer formed on the metal silicicle layer of the second phase, wherein the metal suicide layer is formed between the substrate and the conductive layer and the metal suicide layer has a thickness of less than about 100 Å.

In another embodiment of the present invention, there is provided a method for forming a metal suicide layer in a semiconductor device comprising: i) providing a substrate; ii) forming an insulation layer on the substrate, the insulation having an opening therein; iii) depositing a metal in the opening of the insulation layer so that a first layer including a native metal silicide layer of a first phase is formed at an interfacial area between the substrate and the deposited metal; iv) selectively removing the first layer while retaining the native metal silicide layer of the first phase; v) forming a second layer made of a conductive material on the native metal silicide layer of the first phase and the insulation layer; and vi) reacting the native metal silicide layer of the first phase with the substrate in order to transform the native metal silicide layer into a metal silicide layer having a second phase which has a first stoichiometrical composition ratio that is different from a second stoichiometrical composition ratio of the first phase.

In still another embodiment of the present invention, there is provided a method for forming a metal silicide layer in a semiconductor device comprising: i) providing a substrate having formed thereon a gate oxide film and a gate stack including a conductive material including silicon and having gate sidewall spacers on sides thereof; ii) depositing a metal on the substrate, the gate stack and the gate sidewall spacers, in such a manner that a first layer including a native metal silicide layer of a first phase is formed at an interfacial area between the silicon and the deposited refractory metal; iii) selectively removing the first layer while retaining the native metal silicide layer of the first phase; iv) depositing a first capping layer on a resulting structure; and v) reacting the native metal silicide layer of the first phase with the silicon in order to transform the native metal silicide layer into a metal silicide layer having a second phase which has a first stoichiometrical composition ratio that is different from a second stoichiometrical composition ratio of the first phase and a thickness of less than about 100 Å.

According to yet another embodiment of the present invention, by using the native metal silicide formed at an interfacial area between the metal and the silicon, the native metal silicide layer is reacted with the silicon by means of a heat-treatment process so that a metal silicide layer with high phase stability and low resistance is obtained. Therefore, a thin metal silicide layer is uniformly If formed, and the stepped portion is uniformly coated with the thin metal silicide layer. Additionally, when an embodiment of the present invention is applied to the salicide process, the primary heat-treatment process can be skipped so that the heat budget is reduced. Accordingly, the process is simplified and a shallow junction may be achieved.

These and other features of the present invention will be readily apparent to those of ordinary skill in the art upon review of the detailed description that follows.

BRIEF DESCRIPTION OF THE DRAWINGS

The above features and other advantages of the present invention, as well as others, will become more apparent by describing in detail preferred embodiments thereof with reference to the attached drawings in which:

FIGS. 4A to 4C are sectional views of a semiconductor device illustrating a method for forming metal silicide according to a third embodiment of the present invention.

DETAILED DESCRIPTION OF THE PREFERRED EMBODIMENTS

Korean Patent Application No. 2000-55769, filed on Sep. 22, 2000, and entitled: "Semiconductor Device Having a Metal Silicide Layer and Method for Manufacturing the Same," is incorporated by reference herein in its entirety.

Hereinafter, preferred embodiments of the present invention will be described in detail with reference to accompanying drawings.

Figure 1:
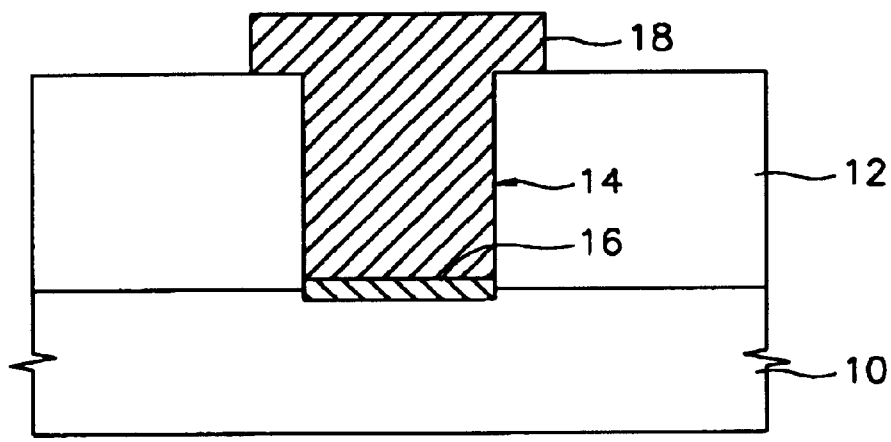
FIG. 1 is a sectional view of a semiconductor device according to an embodiment of the present invention.

FIG. 1 is a sectional view of a semiconductor device of an embodiment of the present invention.

Referring to FIG. 1, an insulation layer 12 is formed on a semiconductor substrate 10 that is comprised of silicon (Si), silicon germanium (SiGe), silicon-on-insulator (SOI), or silicon-germanium-on-insulator (SGOI). The insulation layer 12 has an opening 14 for exposing a semiconductor area, such as a predetermined area of the semiconductor substrate 10. The semiconductor area is either the semiconductor substrate 10 or a silicon layer or silicon germanium layer in the form of a crystalline phase or an amorphous phase formed on the semiconductor substrate 10.

By using native metal silicide of a first phase, which is formed at an interfacial area between metal and silicon, a thin metal suicide layer 16 is formed on the semiconductor area which is exposed by the opening 14. The thin metal silicide layer 16 has a second phase having a first stoichiometrical composition ratio that is different from a second stoichiometrical composition ratio of the first phase. A conductive layer 18 is formed on the metal silicide layer 16 of the second phase thereby forming a metal silicide-semiconductor contact structure.

The metal silicide layer 16 has a thickness of less than about 100 Å and a resistance between about 3 to 20 Ω/□. The conductive layer 18 is comprised of silicon or silicon germanium in the form of the crystalline phase or the amorphous phase. Preferably, the conductive layer 18 is a semiconductor layer comprised of doped polycrystalline silicon.

According to an embodiment of the present invention, in a contact structure between semiconductor layers including the semiconductor substrate, a metal silicide layer is formed between the semiconductor layers so that an ohmic contact is formed with respect to upper and lower semiconductor layers. In the conventional contact structure, an interfacial characteristic is lowered due to a native oxide film remaining on a surface of a lower semiconductor layer so that the contact resistance is increased up to between about 2,000 and 10,000 Ω. The variation of the contact resistance is also increased. On the contrary, an embodiment of the present invention forms the metal silicide layer between the semiconductor layers, so not only is an ohmic contact with respect to the upper and lower semiconductor layers achieved, but also the interfacial characteristic is improved since the native oxide film formed on the surface of the lower semiconductor layer is replaced with silicide. Accordingly, the contact resistance of the metal silicide-semiconductor contact structure is reduced to less than 1,000 Ω and the contact resistance is uniformly achieved.

Hereinafter, various embodiments of the present invention for forming a semiconductor device having a metal silicide layer will be described with reference to the accompanying drawings.

First Embodiment of the Inventive Method

FIGS. 2A to 2D are sectional views of a semiconductor device illustrating a method for forming a metal silicide layer in a semiconductor device according to a first embodiment of the present invention.

Figure 2A:
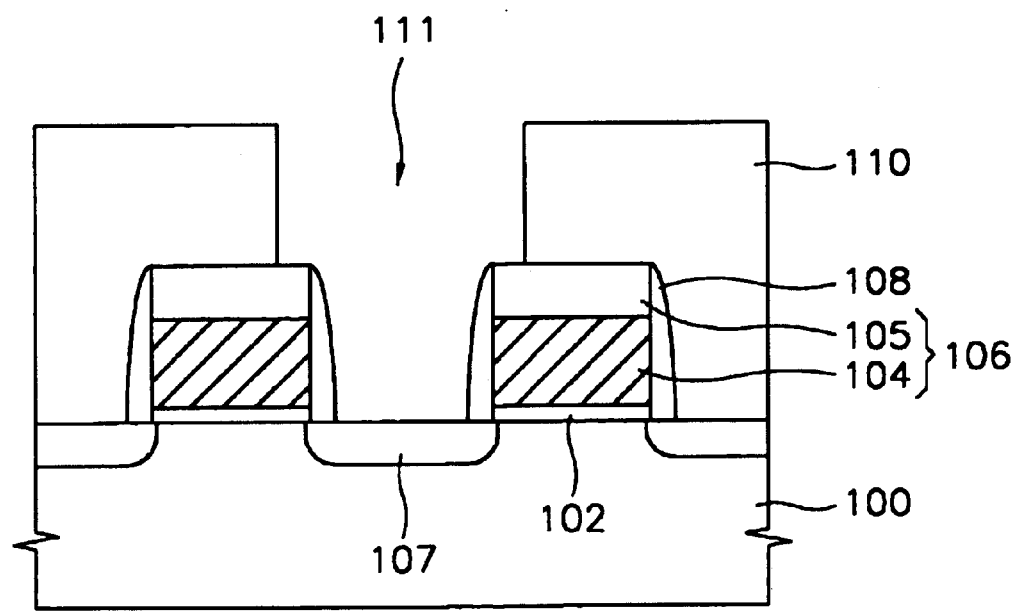
FIGS. 2A to 2D are sectional views of a semiconductor device illustrating a method for forming metal silicide according to a first embodiment of the present invention.

Referring to FIG. 2A, a semiconductor substrate 100 comprising silicon (Si), silicon germanium (SiGe), silicon-on-insulator (SOI), or silicon-germanium-on-insulator (SGOI) is subject to an isolation process so that the semiconductor substrate 100 is divided into an active area and a field area. Then, a gate oxide film 102 and a gate stack 106 are formed on the semiconductor substrate 100. Particularly, the gate oxide film 102 is grown by thermal oxidation, and a highly impurity-doped polycrystalline silicon layer 104 is deposited on the gate oxide film 102. The polycrystalline silicon layer is doped by a conventional doping process, such as a diffusing process, an ion implanting process, or an in-situ doping process. After depositing a mask layer 105 comprising silicon nitride on the polycrystalline silicon layer 104, a photo etching process is carried out for patterning the mask layer 105 and the polycrystalline silicon layer 104, thereby forming the gate stack 106. The mask layer 105 increases the shoulder margin when the following self-align contact process is carried out.

Next, gate sidewall spacers 108 comprising silicon nitride are formed at both sides of the gate stack 106 and a source/drain area 107 is formed on the active area of the substrate 100 using an ion implantation process.

Thereafter, an insulation layer 110 comprising silicon oxide is deposited on an entire surface of the resulting structure. Then, the insulation layer 100 is partially etched by an anisotropic etching process having an etching selectivity between the silicon oxide film and the silicon nitride film so that an opening 111 for exposing the semiconductor area, that is, the source/drain area 107, is formed.

Figure 2B:
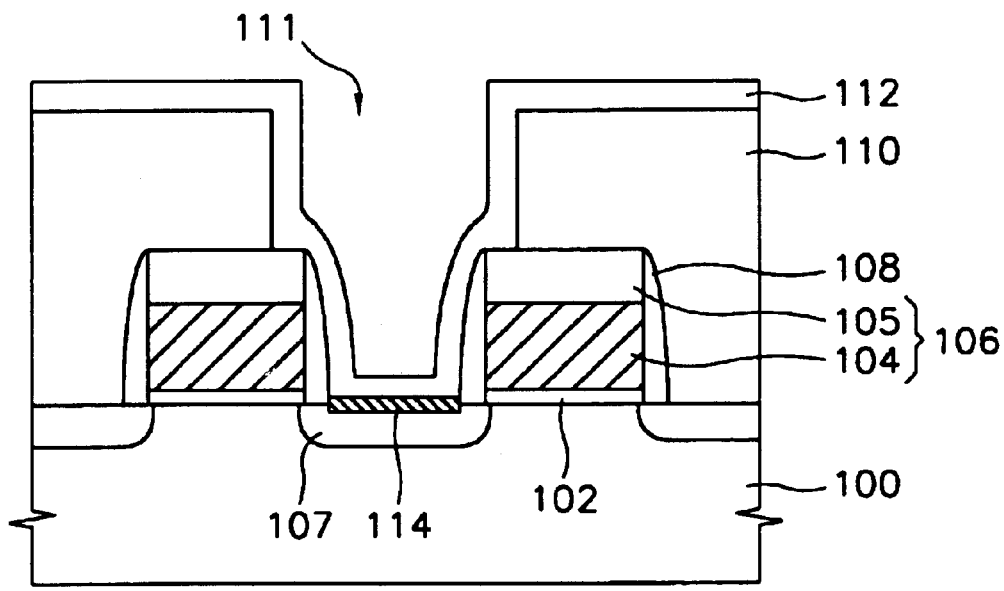

Referring to FIG. 2B, after performing a wet cleaning process for removing the native oxide film and impurities remaining on a silicon surface, an RF plasma etching for cleaning is carried out in RF sputtering equipment. Then, a first layer 112 of a metal (refractory metals, novel metals, transition metals are included) which is one selected from the group consisting of cobalt (Co), titanium (Ti), tungsten (W), nickel (Ni), platinum (Pt), hafnium (Hf), and palladium (Pd) is deposited on the opening 111 and the insulation layer 110, in-situ, to a thickness of greater than 50 Å. As a result, a silicidation reaction between the metal and the silicon occurs at an interfacial surface of the first layer 112 and the silicon area (that is, source/drain area 107), so that a native metal silicide layer 114 of the first phase is formed to a thickness between about 25–35 Å. In addition, while the native metal silicide layer 114 is growing, the impurities remaining at the interfacial surface of the metal and the silicon are removed by the newly created silicide, and the interfacial surface of the metal silicide and the silicon is buried below the initial surface of the silicon area. As a result, a complete metal silicide-silicon contact is formed.

For example, when cobalt is deposited on the silicon substrate to a thickness of 100 Å, a uniform native cobalt monosilicide (CoSi) is stably formed at an interfacial surface between the cobalt layer and the silicon substrate.

Figure 2C:
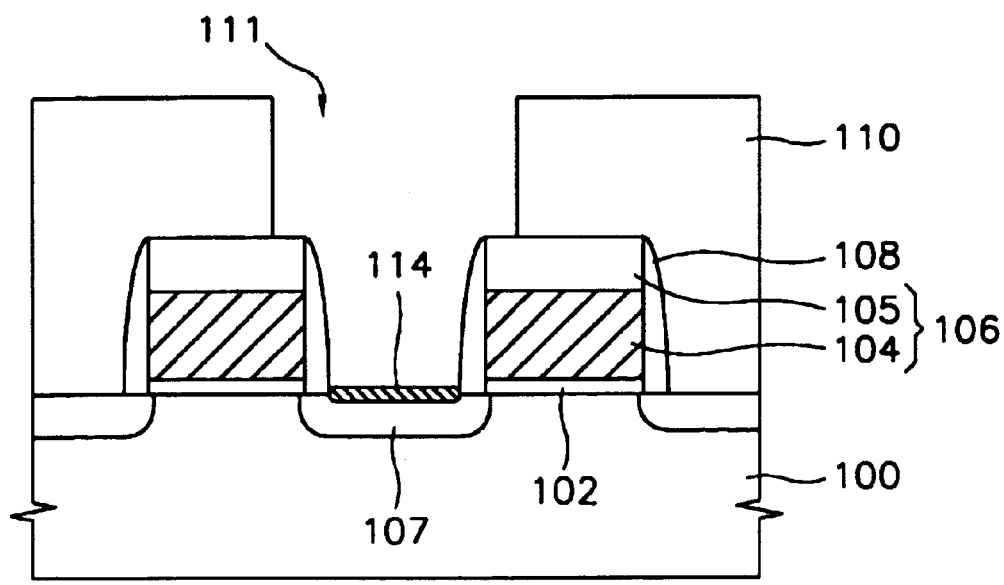

Referring to FIG. 2C, the first layer 112 is selectively removed while retaining the native metal silicide layer 114 by a wet etching process using a chemical having an etching selectivity with respect to the first layer 112 and the metal silicide layer 114. Preferably, in the wet etching process, a pan strip is carried out at a temperature of about 65° C. for about 30 minutes without using $H_2O_2$, or a sulfuric strip process is carried out at a temperature of about 145° C. for about 20 minutes.

Figure 2D:
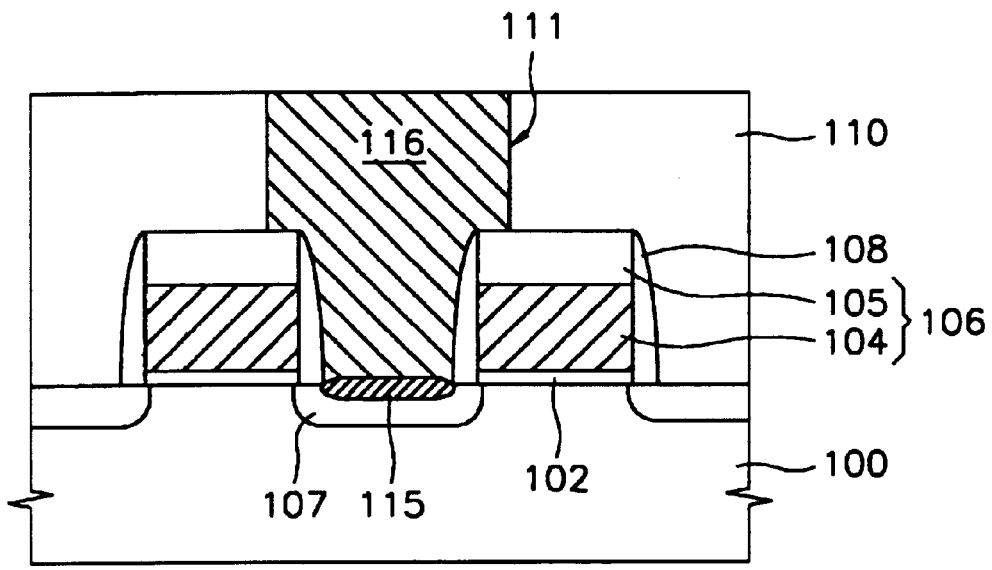

Referring to FIG. 2D, a second layer 116, preferably a doped polycrystalline silicon layer, is deposited on the metal suicide layer 114 of the first phase and the insulation layer 110. The second layer 116 comprises silicon or germanium in the form of a crystalline phase or an amorphous phase and is electrically connected to the source/drain area 107 through the opening 111. Then, a rapid thermal process (RTP) is carried out at a temperature of 850° C. for 30 seconds to cause a reaction between the metal suicide layer 114 of the first phase and the silicon thereby transforming the metal silicide layer 114 into a metal silicide layer 115 having a second phase which has a first stoichiometrical composition ratio different from a second stoichiometrical composition ratio of the first phase. For example, if the cobalt monosilicide (CoSi) having a thickness of about 30 Å is heat-treated, the volume thereof is expanded, so that a cobalt disilicide ($CoSi_2$) having a thickness of less than about 100 Å and a sheet resistance of about 20 Ω/□ is formed.

In the present embodiment, the second layer 116 is deposited before the heat treatment process is carried out, so a predetermined phase transition occurs in the metal silicide layer 114 of the first phase by the heat budget when the deposition process is carried out. At this time, a silicon source for the phase transition is supplied from both the semiconductor substrate 100 and the second layer 116, so a shallow junction of the source/drain area can be achieved. Besides the heat-treatment process, various kinds of processes can be used to cause a reaction between the metal suicide and the silicon.

Then, a chemical mechanical polishing (CMP) process is performed with respect to the resulting structure formed with the metal silicide layer 115 of the second phase, so that the second layer 116 is removed until the surface of the insulation layer 110 is exposed in such a manner that the second layer 116 remains only in the opening 111. As a result, the contact structure consisting of second (polycrystalline silicon) layer 116—silicide layer 115—semiconductor substrate (that is, source/drain area 107) is obtained. The metal silicide layer 115 acts as an ohmic contact with respect to upper and lower semiconductor layers and provides a low contact resistance. The second layer 116 can be formed in a plug shape as shown in FIG. 2D, or can be patterned with a predetermined pattern by means of a photo etching process. The second layer 116 reduces the aspect ratio of a contact hole formed thereon.

According to the first embodiment of the present invention, a low resistance metal silicide having a high phase stability is formed by performing the heat treatment process to the native metal silicide thin film which is uniformly formed at the interfacial area of the metal and the silicon. Therefore, a thin metal silicide layer having a uniform thickness may be achieved In the conventional sputtering method or chemical vapor deposition method for forming metal silicide, the step difference portions are unevenly coated and voids are created. However, the present invention solves the above problems by using an interfacial silicide.

In addition, according to the first embodiment of the present invention, the contact resistance is reduced by forming an ohmic contact of metal silicide-semiconductor. Furthermore, since the semiconductor layer is deposited before the heat treatment process for the phase transition of metal silicide is carried out, a thin junction is effectively achieved.

Second Embodiment of the Inventive Method

FIGS. 3A to 3D are sectional views of a semiconductor device showing a method for forming a metal suicide layer in a semiconductor device according to a second embodiment of the present invention.

Figure 3A:
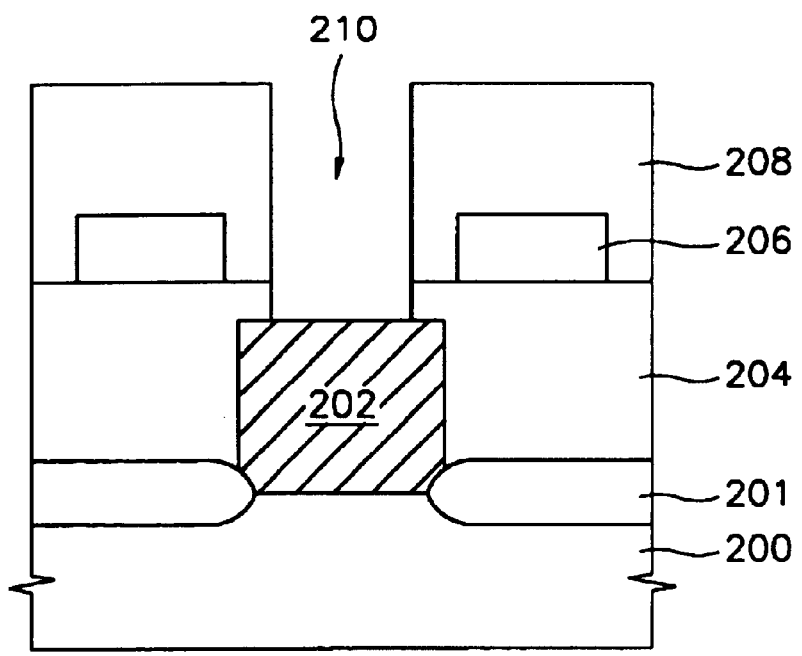
FIGS. 3A to 3D are sectional views of a semiconductor device illustrating a method for forming metal silicide according to a second embodiment of the present invention.

Referring to FIG. 3A, a field oxide film 201 is formed on a semiconductor substrate 200 by means of an isolation process so that the semiconductor substrate 200 is divided into an active area and a field area. Then, a MOS transistor (not shown) is formed on the active area of the substrate 200 by using a MOS transistor manufacturing process. Thereafter, a first insulation layer (not shown) is deposited on the MOS transistor and the substrate 200. The first insulation layer is etched by using a photo etching process thereby exposing the active area.

Next, a silicon or silicon germanium layer, such as a doped polycrystalline silicon layer, in the form of a crystalline phase or an amorphous phase, is deposited on an entire surface of the resulting structure. A pad layer 202 which makes contact with the active area is formed by patterning the doped polycrystalline silicon layer. The pad layer 202 can be formed by means of a self-align contact process.

Thereafter, a second insulation layer 204 is deposited on the pad layer 202 and the substrate 200 and a bit line stack 206 is formed on the second insulation layer 204 by using a bit line fabricating process. The bit line stack 206 is formed as a mono-layer of the doped polycrystalline silicon layer, or formed as a polycide structure of the doped polycrystalline silicon layer and the metal silicide layer. In addition, the bit line stack 206 includes a bit line capping layer which is made of an insulation material and is formed on the bit line stack 206.

Then, after depositing a third insulation layer 208 on the bit line stack 206 and the second insulation layer 204, the third insulation layer 208 is planarized by using a reflow process, an etch-back process or a CMP process. The third insulation layer 208 is partially etched by using a photo etching process so that an opening 210 for exposing a semiconductor area, that is the pad layer 202, is formed. At this time, the opening 210 can be formed by means of a self-align contact process.

Figure 3B:
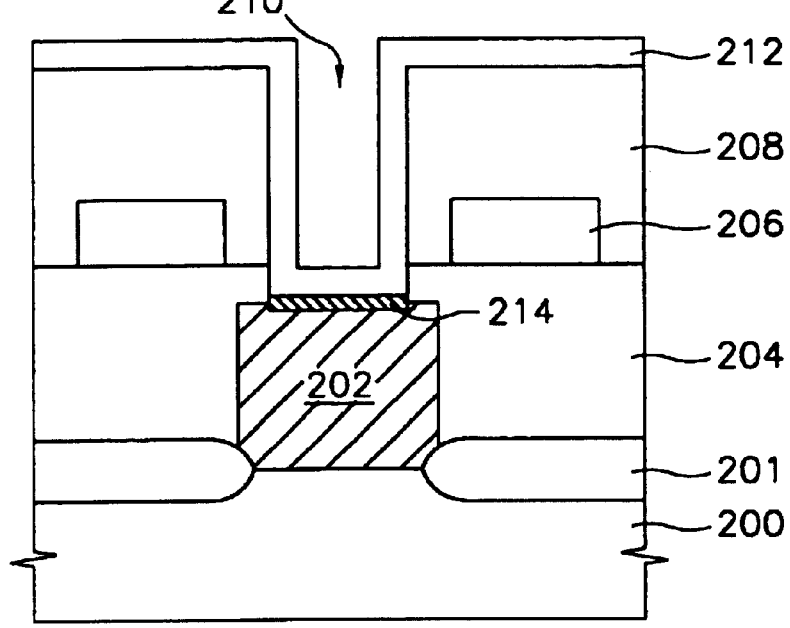

Referring to FIG. 3B, a first layer 212 of a metal which is selected from the group consisting of cobalt (Co), titanium (Ti), tungsten (W), nickel (Ni), platinum (Pt), hafnium (Hf), and palladium (Pd) is deposited on the opening 210 and the third insulation layer 208 to a thickness of greater than about 50 Å. As a result, a silicidation reaction between the metal and the silicon occurs at an interfacial surface of the exposed pad layer 202 and the first layer 212, so that a native metal silicide layer 214 of the first phase is formed to a thickness between about 25–35 Å. For example, when the cobalt is deposited, a native cobalt monosilicide (CoSi) layer is formed at a bottom portion of the opening 210 to a thickness of about 30 Å.

Figure 3C:
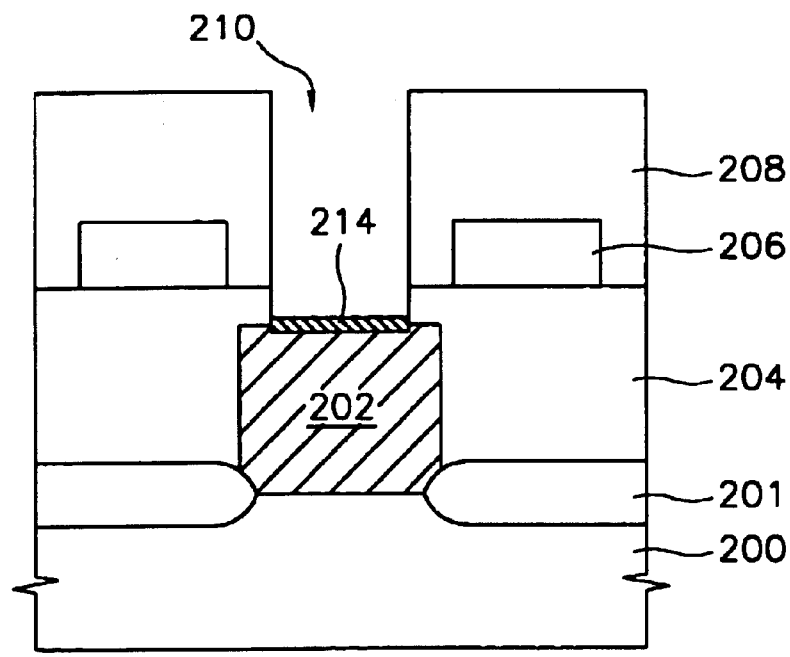

Referring to FIG. 3C, the first layer 212 is selectively removed while retaining the native metal suicide layer 214 of the first phase by a wet etching process using a chemical having an etching selectivity with respect to the first layer 212 and the metal silicide layer 214. Preferably, in the wet etching process, a pan strip is carried out at a temperature of about 65° C. for about 30 minutes without using $H_2O_2$, or a sulfuric strip is carried out at a temperature of about 145° C. for about 20 minutes.

Figure 3D:
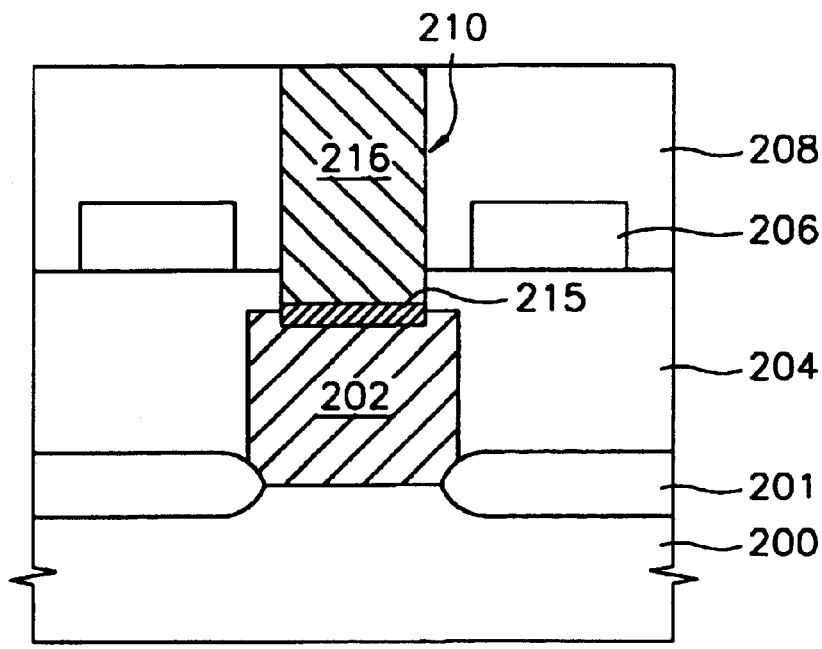

Referring to FIG. 3D, a second layer 216 such as a doped polycrystalline silicon layer is deposited on the metal silicide layer 214 of the first phase and the third insulation layer 208. The second layer 216 comprises silicon or germanium in the form of a crystalline phase or an amorphous phase and is electrically connected to the pad layer 202 through the opening 210. At this time, a predetermined phase transition occurs in the metal silicide layer 214 of the first phase by the heat budget when the deposition process is carried out.

Then, a rapid thermal process (RTP) is carried out at a temperature of about 850° C. for about 30 seconds to cause a reaction between the metal silicide layer 214 of the first phase and the silicon, thereby transforming the metal silicide layer 214 into a metal suicide layer 215 having a second phase which has a first stoichiometrical composition ratio different from a second stoichiometrical composition ratio of the first phase. For example, if the cobalt monosilicide (CoSi) layer having a thickness of about 30 Å is heat-treated, the volume thereof is expanded, so that a cobalt disilicide ($CoSi_2$) layer having a thickness of less than 100 Å and a sheet resistance of 20 $\Omega/\square$ is formed.

Thereafter, a chemical mechanical polishing (CMP) process is performed to remove the polycrystalline silicon layer 216 such that the surface of the third insulation layer 208 is exposed so that the polycrystalline silicon layer 216 remains only in the opening 210. As a result, the contact structure consisting of polycrystalline silicon layer 216—metal silicide layer 215—pad layer 202 is obtained. The metal silicide layer 215 acts as an ohmic contact with respect to upper and lower semiconductor layers. The polycrystalline silicon layer 216 can be formed in a plug shape as shown in FIG. 3D, or can be patterned with a storage electrode pattern by means of a photo etching process.

According to the second embodiment of the present invention, with the replacement of the conventional semiconductor-semiconductor structure with the inventive semiconductor-metal silicide-semiconductor ohmic contact structure, interfacial feature is improved and the contact resistance is reduced.

Third Embodiment of the Inventive Method

Figure 4A:
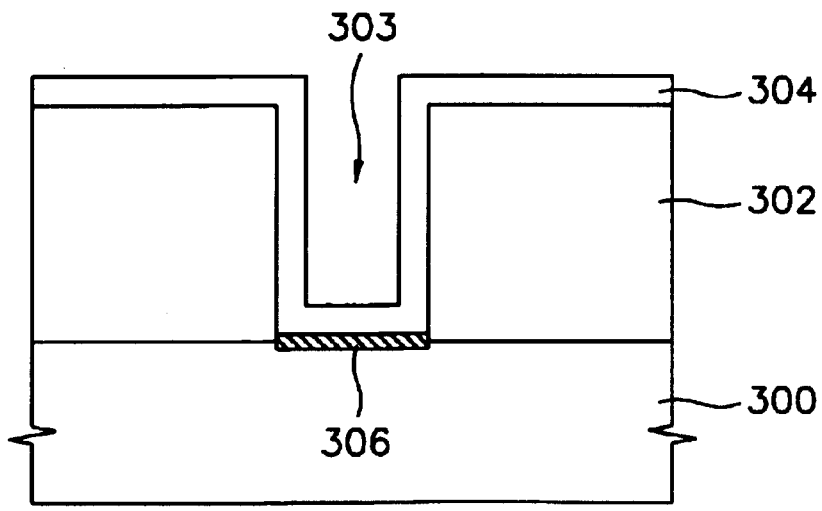

FIGS. 4A to 4C are sectional views of a semiconductor device showing a method for forming a metal silicide layer in a semiconductor device according to a third embodiment of the present invention.

Referring to FIG. 4A, a device structure (not shown) is formed on a semiconductor substrate 300 consisting of silicon (Si), silicon germanium (SiGe) and silicon-on-insulator (SOI), or silicon-germanium-on-insulator (SGOI). The device structure includes a transistor, a bit line and a capacitor.

Then an insulation layer 302 is deposited on the device structure and the substrate 300. Thereafter, the insulation layer 302 is etched to form a contact hole 303 for exposing a semiconductor area, such as a predetermined area of the semiconductor substrate 300. The semiconductor area exposed through the contact hole 303 is either the semiconductor substrate 300 or a silicon layer or silicon germanium layer formed on the semiconductor substrate 300 in the form of a crystalline phase or an amorphous phase.

Then, a first layer 304 of a metal which is one selected from the group consisting of cobalt (Co), titanium (Ti), tungsten (W), nickel (Ni), platinum (Pt), hafnium (Hf), and palladium (Pd) is deposited on the contact hole 303 and the insulation layer 302 to a thickness of greater than 50 Å. As a result, a silicidation reaction between the metal and the silicon occurs at the bottom of the contact hole 303, so that a native metal silicide layer 306 of a first phase is formed to a thickness between about 25–35 Å.

Referring to FIG. 4B, the first layer 304 is selectively removed while retaining the native metal silicide layer 306 of the first phase by a wet etching process using a chemical having an etching selectivity with respect to the first layer 304 and the metal silicide layer 306. Preferably, in the wet etching process, a pan strip is carried out at a temperature of about 65° C. for about 30 minutes without using $H_2O_2$, or a sulfuric strip is carried out at a temperature of about 145° C. for about 20 minutes.

Referring to FIG. 4C, a second layer 308 comprising titanium nitride (TiN) is deposited on the metal silicide layer 306 of the first phase and the insulation layer 302. Then, a rapid thermal process (RTP) is carried out at a temperature of about 850° C. for about 30 seconds in order to cause a reaction between the metal silicide layer 306 of the first phase and the silicon, thereby transforming the metal silicide layer 306 into a metal silicide layer 307 having a second phase which has a first stoichiometrical composition ratio different from a second stoichiometrical composition ratio of the first phase. The second layer 308 can be made of metallic material instead of titanium nitride (TiN). The second layer 308 acts as a diffusion barrier layer.

Next, a third layer 310 consisting of metal is deposited on the second layer 308 to bury the contact hole 303. As a result, an ohmic contact structure consisting of the third layer 310—metal silicide layer 307—semiconductor substrate 300 is obtained.

According to the third embodiment of the present invention, a low resistance metal silicide having a high phase stability can be formed by using a native metal silicide thin film formed at an interfacial surface between a metal layer and a silicon area. Therefore, the metal silicide makes direct contact with the silicon substrate so that an ohmic contact is formed, thereby reducing the contact resistance.

Fourth Embodiment of the Inventive Method

FIGS. 5A to 5D are sectional views of a semiconductor device showing a method for forming a metal silicide layer in a semiconductor device according to a fourth embodiment of the present invention.

Figure 5A:
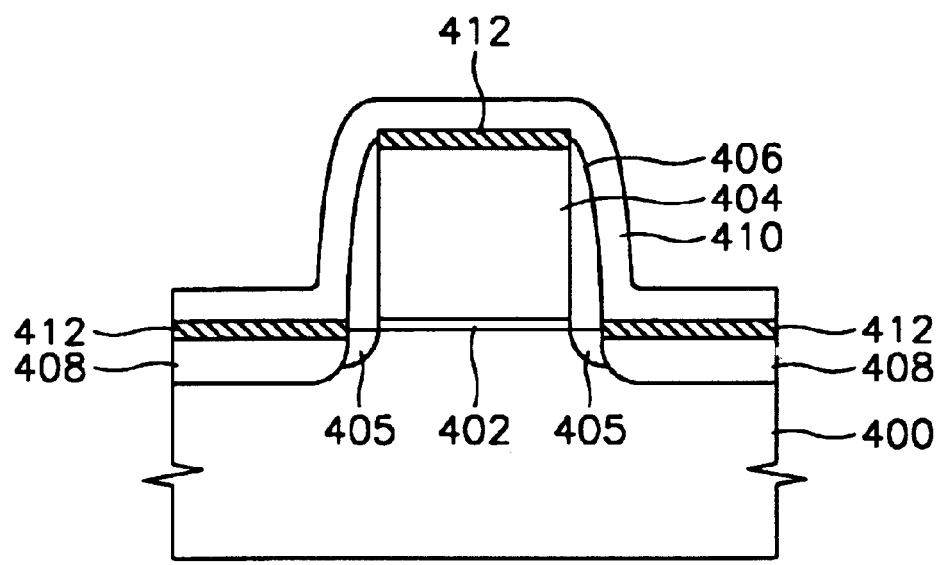
FIGS. 5A to 5D are sectional views of a semiconductor device illustrating a method for forming metal silicide according to a fourth embodiment of the present invention.

Referring to FIG. 5A, a semiconductor substrate 400 consisting of silicon (Si), silicon germanium (SiGe) and silicon-on-insulator (SOI), or silicon-germanium-on-insulator (SGOI) is subject to an isolation process so that the semiconductor substrate 400 is divided into an active area and a field area. Then, a gate oxide film 402 is grown on the semiconductor substrate 400 by means of a thermal oxidation process. Then, a semiconductor material layer, such as a silicon layer or a silicon germanium layer in the form of a crystalline phase or an amorphous phase is deposited on the gate oxide film 402. The semiconductor material layer is patterned by using a photo etching process so that a gate structure 404 is formed. Preferably, the gate structure 404 is formed as a highly-impurity doped polycrystalline silicon layer by means of a doping process, such as a diffusing process, an ion implanting process, or an in-situ doping process. In addition, when it is required to form the metal silicide layer only in the source/drain area, a capping insulation layer (not shown) is stacked on an upper surface of the gate structure 404.

Then, after forming gate sidewall spacers 406 made of silicon oxide film at both sides of the gate stack 404, a source/drain area 408 is formed on the active area of the semiconductor substrate 400 by using an ion implantation process. In addition, it is possible to form a lightly-doped source/drain area 405 aligned on the gate stack 404 by using the ion implantation process before the gate sidewall spacers 404 are formed on the gate stack 404.

Thereafter, a cleaning process is carried out to remove impurities including particles remaining on the semiconductor substrate 400 and a native oxide film created on a surface of the silicon area. Then the semiconductor substrate 400 is conveyed into an RF sputtering chamber. In order to prevent recreation of the native oxide film while the semiconductor substrate 400 is being conveyed, a cobalt layer 410 is deposited in-situ, after performing the RF plasma etching process, on the gate stack 404, the gate sidewall spacers 406, and the semiconductor substrate 400, to a thickness of about 100 Å. At this time, one of titanium (Ti), tungsten (W), nickel (Ni), platinum (PT), hafnium (Hf), and palladium (Pd) may be selectively used instead of cobalt (Co).

As the cobalt layer 410 is deposited, the silicidation reaction between silicon and cobalt is generated at an interfacial surface of the exposed silicon area and the cobalt layer 410 so that a cobalt suicide layer of the first phase, that is, a cobalt monosilicide (CoSi) layer 412, is uniformly formed on the upper surface of the gate stack 404 and the upper surface of the source/drain area 408, to a thickness of about 30 Å. At this time, the native silicide layer in the form of a monosilicide may not be achieved if another refractory metal is used instead of cobalt.

Figure 5B:
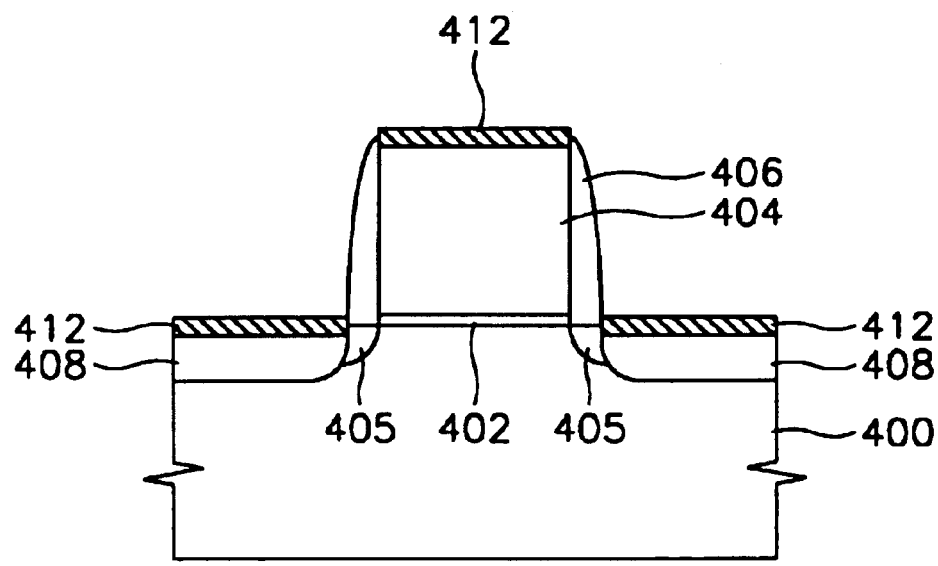

Referring to FIG. 5B, the cobalt layer 410 is selectively removed while retaining the cobalt monosilicide layer 412 by a wet etching process using a chemical having an etching selectivity with respect to cobalt and silicide. Preferably, in the wet etching process, a pan strip is carried out at a temperature of about 65° C. for about 30 minutes without using $H_2O_2$, or a sulfuric strip is carried out at a temperature of about 145° C. for about 20 minutes.

Figure 5C:
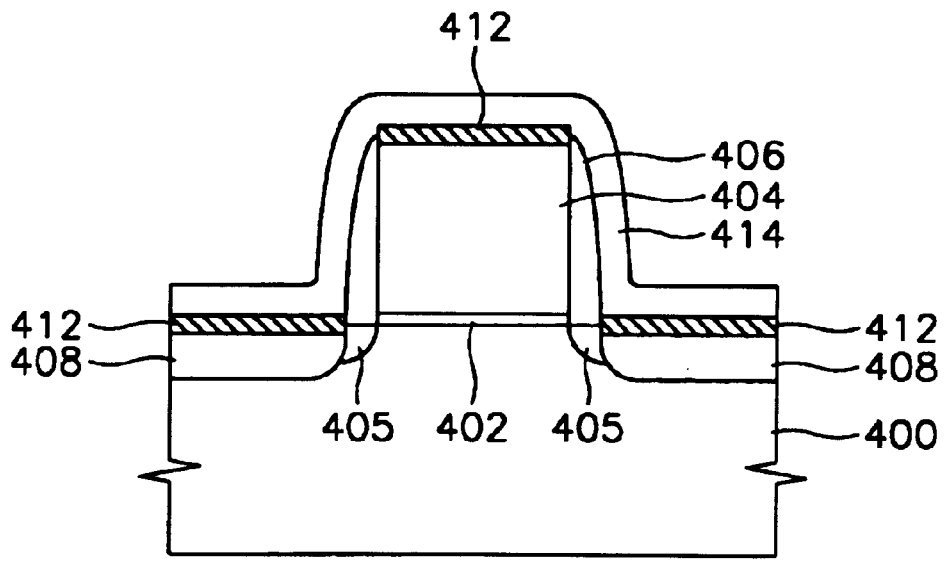

Referring to FIG. 5C, a first capping layer 414 is deposited on the semiconductor substrate 400 including the cobalt monosilicide layer 412. The first capping layer 414 is made of a metallic compound selected from the group consisting of titanium nitride (TiN), titanium tungsten (TiW), tantalum nitride (TaN), and tungsten nitride (WN). In addition, the first capping layer 414 can be made of an insulation material, such as SiN or SiON. The first capping layer 414 prevents the diffusing of cobalt and controls the speed of the silicidation reaction when the following heat treatment process is carried out.

Figure 5D:
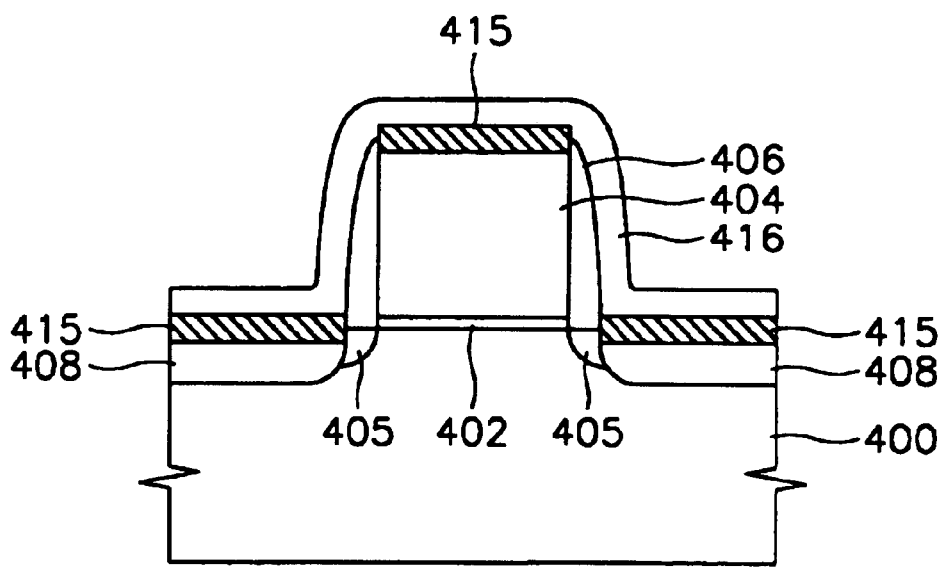

Referring to FIG. 5D, a rapid thermal process (RTP) is carried out at a temperature of about 850° C. for about 30 seconds to cause a reaction between metal silicide and silicon, thereby transforming the phase of the cobalt monosilicide layer 412 into a cobalt disilicide ($CoSi_2$) layer 415 having a thickness of less than about 100 Å and a sheet resistance of about 20 Ω/□. At this time, if another refractory metal is used instead of cobalt, the resulting silicide layer may not be formed in a monosilicide phase.

After removing the first capping layer 414, an insulation material having an etching selectivity with respect to the cobalt disilicide ($CoSi_2$) layer 415 is deposited on the resulting structure to form a second capping layer 416. Then a contact hole (not shown) for exposing the source/drain area 408 is formed by partially etching the second capping layer 416.

According to the fourth embodiment of the present invention, a uniform and thin metal silicide layer can be obtained by using the native silicidation reaction generated at an interfacial area of metal and silicon. In addition, unlike the conventional silicide forming method, which requires performing the heat treatment process twice to obtain the stable silicide layer, the present invention can obtain the low resistance metal silicide layer with high phase stability by performing the heat treatment process only once. Accordingly, the heat budget is reduced so that the shallow junction can be effectively achieved. Furthermore, according to the present invention, the process is simplified and reproducibility is improved and thereby makes mass production possible.

In sum, the present invention allows a low resistance metal silicide layer with high phase stability to be obtained by causing a reaction between the native metal suicide layer of the first phase and silicon by means of the heat treatment process in order that a thin metal suicide layer can be uniformly formed. Also, since the present invention uses the native metal silicide layer, the step difference portion can be uniformly coated.

Furthermore, since the present invention does not require performing the heat treatment process twice, the heat budget is reduced. Accordingly, when the present invention is applied to a salicidation process, a shallow junction is effectively obtained while the process is simplified.

Preferred embodiments of the present invention have been disclosed herein and, although specific terms are employed, they are used and are to be interpreted in a generic and descriptive sense only and not for the purpose of limitation. Accordingly, it will be understood by those of ordinary skill in the art that various changes in form and scope may be made without departing from the spirit and scope of the invention as set forth in the following claims.

What is claimed is:

1. A method of forming a metal silicide layer in a semiconductor device comprising:
    i) providing a substrate;
    ii) forming an insulation layer on the substrate, the insulation layer having an opening therein;
    iii) depositing a metal in the opening in the insulation layer so that a first layer including a native metal silicide layer of a first phase is formed at an interfacial surface between the substrate and the deposited metal;
    iv) selectively removing the first layer while retaining the native metal silicide layer of the first phase;
    v) forming a second layer made of a doped polycrystalline silicon layer on the native metal silicide layer of the first phase and the insulation layer; and
    vi) reacting the native metal silicide layer of the first phase with the substrate so as to transform the native metal silicide layer into a metal silicide layer having a second phase which has a first stoichiometrical composition ratio different from a second stoichiometrical composition ratio of the first phase and a thickness of less than about 100 Å.

2. A method of forming a metal silicide layer in a semiconductor device as claimed in claim 1, wherein the substrate comprises a material selected from the group consisting of: silicon, silicon germanium, silicon-on-insulator (SOI) and silicon-germanium-on-insulator (SGOI).

3. A method of forming a metal silicide layer in a semiconductor device as claimed in claim 1, further comprising forming a silicon layer or a silicon germanium layer in a form of a crystalline phase or an amorphous phase on the substrate.

4. A method of forming a metal silicide layer in a semiconductor device as claimed in claim 1, wherein the second layer includes titanium nitride (TiN).

5. A method of forming a metal silicide layer in a semiconductor device as claimed in claim 1, wherein the first layer is comprised of a material selected from the group consisting of cobalt (Co), titanium (Ti), tungsten (W), nickel (Ni), platinum (PT), hafnium (Hf), and palladium (Pd).

6. A method of forming a metal silicide layer in a semiconductor device as claimed in claim 1, wherein the first layer is deposited to a thickness of greater than about 50 Å.

7. A method of forming a metal silicide layer in a semiconductor device as claimed in claim 1, wherein, in reacting the native metal silicide layer of the first phase, the native metal silicide layer of the first phase is transformed into the metal silicide layer of the second phase using a heat-treatment process.

8. A method of forming a metal silicide layer in a semiconductor device, comprising:
    i) providing a substrate having formed thereon a gate oxide film, a gate stack having sides, the gate stack having gate sidewall spacers on the sides thereof;
    ii) depositing a metal on the substrate, the gate stack and the gate sidewall spacer, the gate stack including a conductive material including a silicon, in such a manner that a first layer including a native metal silicide layer of a first phase is formed at an interfacial surface between the silicon and the deposited metal without performing a heat treatment process;
    iii) selectively removing the first layer while retaining the native metal silicide layer of the first phase;
    iv) depositing a first capping layer on a resulting structure; and
    v) performing only one heat treatment process to cause a reaction between the native metal silicide layer of the first phase with the silicon so as to transform the native metal silicide layer into a metal silicide layer having a second phase which has a first stoichiometrical composition ratio different from a second stoichiometrical composition ratio of the first phase, the metal silicide layer being formed to a thickness of less than about 100 Å.

9. A method of forming a metal silicide layer in a semiconductor device as claimed in claim 8, wherein the substrate comprises a material selected from the group consisting of silicon, silicon germanium, silicon-on-insulator (SOI) and silicon-germanium-on-insuiator (SGOI).

10. A method of forming a metal silicide layer in a semiconductor device as claimed in claim 8, wherein the gate stack comprises a silicon layer or a silicon germanium layer in a form of a crystalline phase or an amorphous phase.

11. A method of forming a metal silicide layer in a semiconductor device as claimed in claim 8, wherein the gate stack has a capping insulation layer at an upper surface thereof.

12. A method of forming a metal silicide layer in a semiconductor device as claimed in claim 8, wherein the first capping layer comprises a metallic material.

13. A method of forming a metal silicide layer in a semiconductor device as claimed in claim 12, wherein the first capping layer is comprised of a material selected from the group consisting of titanium nitride (TiN), titanium tungsten (TiW), tantalum nitride (TaN), and tungsten nitride (WN).

14. A method of forming a metal silicide layer in a semiconductor device as claimed in claim 8, wherein the first capping layer is comprised of an insulation material.

15. A method of forming a metal silicide layer in a semiconductor device as claimed in claim 8, wherein the first capping layer is comprised of a material selected from the group of SiN and SiON.

16. A method of forming a metal silicide layer in a semiconductor device as claimed in claim 8, further comprising:
    vi) removing the first capping layer; and
    vii) depositing a second capping layer on a resulting structure.

17. A method of forming a metal silicide layer in a semiconductor device as claimed in claim 16, wherein the second capping layer is made of an insulation material having an etching selectivity with respect to the metal silicide layer of the second phase.

18. A method of forming a metal silicide layer in a semiconductor device as claimed in claim 8, wherein the first layer is comprised of a material selected from the group consisting of cobalt (Co), titanium (Ti), tungsten (W), nickel (Ni), platinum (Pt), hafnium (Hf) and palladium (Pd).

19. A method of forming a metal silicide layer in a semiconductor device as claimed in claim 8, wherein the first layer is deposited to a thickness of about 100 Å.

20. A method of forming a metal silicide layer in a semiconductor device comprising:
  i) providing a substrate;
  ii) forming an insulation layer on the substrate, the insulation layer having an opening therein;
  iii) depositing a metal in the opening in the insulation layer so that a first layer including a native metal silicide layer of a first phase is formed at an interfacial surface between the substrate and the deposited metal without performing a heat treatment process;
  iv) selectively removing the first layer while retaining the native metal silicide layer of the first phase;
  v) forming a second layer made of a conductive material on the native metal silicide layer of the first phase and the insulation layer; and
  vi) performing only one heat treatment process to cause a reaction between the native metal silicide layer of the first phase with the substrate so as to transform the native metal silicide layer into a metal silicide layer having a second phase which has a first stoichiometrical composition ratio different from a second stoichiometrical composition ratio of the first phase and a thickness of less than about 100 Å.

21. A method of forming a metal silicide layer in a semiconductor device as claimed in claim 20, wherein the second layer comprises a silicon layer or a silicon germanium layer in the form of a crystalline phase or an amorphous phase.

22. A method of forming a metal silicide layer in a semiconductor device as claimed in claim 20, wherein the second layer is comprised of a metal or a metallic material.

23. A method of forming a metal silicide layer in a semiconductor device as claimed in claim 20, wherein the second layer is a semiconductor layer.

24. A method of forming a metal silicide layer in a semiconductor device as claimed in claim 20, wherein the second layer is a doped polycrystalline silicon.

* * * * *